United States Patent
Krivokapic

(10) Patent No.: US 7,402,505 B1
(45) Date of Patent: Jul. 22, 2008

(54) SINGLE ELECTRON DEVICES FORMED BY LASER THERMAL ANNEALING

(75) Inventor: Zoran Krivokapic, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 489 days.

(21) Appl. No.: 10/914,171

(22) Filed: Aug. 10, 2004

Related U.S. Application Data

(62) Division of application No. 10/146,022, filed on May 16, 2002, now Pat. No. 7,105,425.

(51) Int. Cl.
 *H01L 21/20* (2006.01)
 *H01L 29/76* (2006.01)
(52) U.S. Cl. .......................... 438/486; 438/487; 438/509; 438/795; 257/314; 257/315; 257/E29.298
(58) Field of Classification Search ............... 438/486, 438/487, 509, 795; 257/314, 315, 317; 977/773, 977/784
See application file for complete search history.

(56) References Cited

U.S. PATENT DOCUMENTS

| 5,663,571 | A | 9/1997 | Ugajin |
| 5,679,962 | A | 10/1997 | Kizuki |
| 5,714,766 | A | 2/1998 | Chen et al. |
| 5,731,598 | A | 3/1998 | Kado et al. |
| 5,766,989 | A | 6/1998 | Maegawa et al. |
| 6,060,743 | A | 5/2000 | Sugiyama et al. |
| 6,165,842 | A | 12/2000 | Shin et al. |
| 6,177,302 | B1 | 1/2001 | Yamazaki et al. |
| 6,274,903 | B1 | 8/2001 | Nomoto et al. |
| 6,320,784 | B1 * | 11/2001 | Muralidhar et al. ......... 365/151 |
| 6,407,424 | B2 * | 6/2002 | Forbes ........................ 257/315 |
| 6,413,819 | B1 | 7/2002 | Zafar et al. |
| 6,461,917 | B2 | 10/2002 | Nomoto et al. |
| 2003/0183901 | A1 * | 10/2003 | Kanda et al. ................ 257/510 |

FOREIGN PATENT DOCUMENTS

JP 09083075 A 3/1997

OTHER PUBLICATIONS

Grom et al, Ordering and Self-Organization in Nanocrystalline Silicon, Sep. 21, 2000, Nature 407, 358-361.
Wang et al., Patterned Distribution of Silicon Nanocrystals Prepared by Pulsed Laser Interference Crystallization of an Ultrathin A—SI:H Single Layer, Jan. 20, 2003, J. Phys.: Condens. Matter 15 (2003) 609-615.

\* cited by examiner

*Primary Examiner*—Hsien-ming Lee
(74) *Attorney, Agent, or Firm*—McDermott Will & Emery LLP

(57) ABSTRACT

A semiconductor device with a superlattice and method of making same includes forming a layer of amorphous silicon over a substrate, and forming a layer of nanocrystals by laser thermal annealing the layer of amorphous silicon. A gate dielectric is formed between the layer of amorphous silicon and the substrate. A dielectric layer is formed on the layer of amorphous silicon. The steps of forming the layer of amorphous silicon and forming the dielectric layer can be repeated. The thickness of the dielectric layer is between about 25 to 40 angstroms, and the thickness of the amorphous silicon layer is between about 30 to 50 angstroms. The average diameter of the nanocrystals is less than 40 angstroms.

12 Claims, 6 Drawing Sheets

SINGLE ELECTRON DEVICES FORMED BY LASER THERMAL ANNEALING

This application is a divisional of application Ser. No. 10/146,022 filed May 16, 2002 now U.S. Pat. No. 7,105,425.

FIELD OF THE INVENTION

The present invention relates to the manufacturing of semiconductor devices, and more particularly, to laser anneal processes for producing single electron devices.

BACKGROUND OF THE INVENTION

Over the last few decades, the semiconductor industry has undergone a revolution by the use of semiconductor technology to fabricate small, highly integrated electronic devices, and the most common semiconductor technology presently used is silicon-based. A large variety of semiconductor devices have been manufactured having various applications in numerous disciplines. One silicon-based semiconductor device is a metal-oxide-semiconductor (MOS) transistor. The MOS transistor is one of the basic building blocks of most modern electronic circuits. Importantly, these electronic circuits realize improved performance and lower costs, as the performance of the MOS transistor is increased and as manufacturing costs are reduced.

A typical MOS semiconductor device includes a semiconductor substrate on which a gate electrode is disposed. The gate electrode, which acts as a conductor, receives an input signal to control operation of the device. Source and drain regions are typically formed in regions of the substrate adjacent the gate electrodes by doping the regions with a dopant of a desired conductivity. The conductivity of the doped region depends on the type of impurity used to dope the region. The typical MOS transistor is symmetrical, in that the source and drain are interchangeable. Whether a region acts as a source or drain typically depends on the respective applied voltages and the type of device being made. The collective term source/drain region is used herein to generally describe an active region used for the formation of either a source or drain.

MOS devices typically fall in one of two groups depending on the type of dopants used to form the source, drain and channel regions. The two groups are often referred to as n-channel and p-channel devices. The type of channel is identified based on the conductivity type of the channel which is developed under the transverse electric field. In an n-channel MOS (NMOS) device, for example, the conductivity of the channel under a transverse electric field is of the conductivity type associated with n-type impurities (e.g., arsenic or phosphorous). Conversely, the channel of a p-channel MOS (PMOS) device under the transverse electric field is associated with p-type impurities (e.g., boron).

A type of device, commonly referred to as a MOS field-effect-transistor (MOSFET), includes a channel region formed in the semiconductor substrate beneath the gate area or electrode and between the source and drain regions. The channel is typically lightly doped with a dopant having a conductivity type opposite to that of the source/drain regions. The gate electrode is generally separated from the substrate by an insulating layer, typically an oxide layer such as $SiO_2$. The insulating layer is provided to prevent current from flowing between the gate electrode and the source, drain or channel regions. In operation, a voltage is typically developed between the source and drain terminals. When an input voltage is applied to the gate electrode, a transverse electric field is set up in the channel region. By varying the transverse electric field, it is possible to modulate the conductance of the channel region between the source and drain regions. In this manner an electric field is used to control the current flow through the channel region.

A widely-used semiconductor device is a floating gate memory. A floating gate memory has a floating gate positioned between a control gate and a channel. Information is stored within the memory device through (thousands) of stored charges on the floating gate. The information stored in a floating gate memory device can be determined because differing amounts of charge on the floating gate will shift the threshold voltage of the transistor. Zero excess charge on the floating gate produces a relatively low threshold voltage, which can be used to represent a stored logic 0, and stored charges on the floating gate produces a relatively high threshold voltage, which can be used to represent a stored logic 1.

A recent development has been to replace the conventional floating gate in a floating gate memory device with a single-electron device utilizing a phenomena known as Coulomb Blockade. The single-electron device can be thought of as a series of small capacitors (also known as quantum dots/granular regions/nanocrystals) that each store a single electron. The Coulomb Blockade effect occurs when the tunneling of an electron into a region prevents further tunneling of other electrons into the same region. If each region/capacitor is sufficiently small, the charging energy of the capacitor becomes so large that it is energetically unfavorable for two or more electrons to be located in a single region.

For a capacitor of capacitance C, the energy that needs to be imparted to a single electron to force the electron into the capacitor/region is the charging energy $E_C$ of a single electron, which is given by $E_C = e^2/2C$, where e is the charge on the electron. To achieve a Coulomb Blockade effect to prevent an electron from entering into one region after one electron has already been stored in the region, the charging energy is required to be greater than a thermal fluctuation energy kT, where k is the Stefan Boltzmann constant and T is the temperature. Assuming that there is no voltage increase applied externally when the temperature remains constant, the Coulomb Blockade effect is achieved by satisfying the condition of $e^2/(4\pi \in_i D) > kT$, where D is the size of the region.

An advantage of a single electron structure is that the number of electrons stored by the individual regions in the single electron structure can be precisely controlled. Furthermore, the number of electrons stored is significantly reduced when compared to conventional floating gates. Thus, the current used for writing can be reduced, which advantageously reduces the consumption of power by the device.

A problem associated with single electron devices is controlling the formation of the individual nanocrystals or capacitive regions. Current processing techniques, which involve thermal annealing amorphous silicon to obtain the nanocrystals, have difficulty in achieving small sized nanocrystals (less than about 40 angstroms). However, the ability to achieve smaller size of the nanocrystals is desirable, as smaller sized nanocrystals can achieve Coulomb Blocking at higher operating temperatures. Furthermore, a smaller sized nanocrystal retains its charge longer than a larger nanocrystal. Accordingly, a need exists for an improved process that allows for a greater flexibility in forming single-electron devices.

SUMMARY OF THE INVENTION

This and other needs are met by embodiments of the present invention which provide a method of manufacturing a semiconductor device. The method includes forming a layer of amorphous silicon over a substrate, and forming a layer or superlattice of nanocrystals by laser thermal annealing the layer of amorphous silicon. A gate dielectric is formed between the layer of amorphous silicon and the substrate, and a dielectric layer is formed on the layer of amorphous silicon. The steps of forming the layer of amorphous silicon and forming the dielectric layer can be repeated.

By forming the superlattice of nanocrystals by laser thermal annealing, the silicon will melt and then recrystallize rapidly. In so doing, an average diameter of the nanocrystals is less than 40 angstroms and in some instances less than 30 angstroms. By providing smaller size nanocrystals, the charge is retained in each nanocrystal longer. Furthermore, the semiconductor device can operate at higher temperatures.

In a further aspect of the present invention, the thickness of the dielectric layer is between about 25 to 40 angstroms, and the thickness of the amorphous silicon layer is between about 30 to 50 angstroms. Also, the step of forming nanocrystals occurs only after a final amorphous silicon layer is formed. Alternatively, the step of forming nanocrystals occurs after each amorphous silicon layer is formed.

In another embodiment of the present invention, a semiconductor device is provided. The semiconductor device includes a substrate, a gate dielectric, at least one layer of nanocrystals, and a dielectric layer. The gate dielectric is formed on the substrate, and the at least one layer of nanocrystals is formed over the gate dielectric. A dielectric layer is formed on each of the layers of nanocrystals. Also, the average diameter of the nanocrystals is less than 40 angstroms, and the nanocrystals are formed by laser thermal annealing.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DETAILED DESCRIPTION OF THE INVENTION

The present invention addresses and solves, at least in part, the problem of being able to retain a charge in nanocrystals in a floating gate at high temperatures. This is achieved, in part, by forming nanocrystals having a reduced average grain size. As the average grain size of a nanocrystal becomes smaller, the ability for the nanocrystal to retain charge at higher temperatures increases. By forming the nanocrystals using laser thermal annealing, nanocrystals with an average grain size less than 40 angstroms can be provided. This process can be used with one or more layers of nanocrystals in a floating gate.

An embodiment of the present invention is illustrated in FIGS. 1A-1F. A silicon substrate is provided and can be formed from any material suitable for integrated circuit manufacture. However, in one aspect, the substrate is formed from single-crystal silicon, with a <100> crystallographic orientation and which has been slightly doped with n-type or p-type impurities. Separate semiconductor devices are separated on the silicon substrate using isolation structures (not shown), such as a field oxide or a shallow isolation trench.

A shallow isolation trench, for example, can be formed by etching either isotropically with wet techniques or anisotropically with dry etch techniques. An oxide is thereafter deposited within the trench. As an alternative to the shallow isolation trench, a field oxide can be formed. A field oxide is typically formed via thermal oxidation in an oxygen-steam ambient at temperatures from about 850 to 1050° C. A patterned, oxidation-resistant mask can be used to prevent oxidation of non-isolation device regions. After formation of the field oxide, the mask is removed using known techniques, for example hot phosphoric acid for a silicon nitride mask or buffered hydrofluoric acid for a pad oxide mask.

Figure 1A:
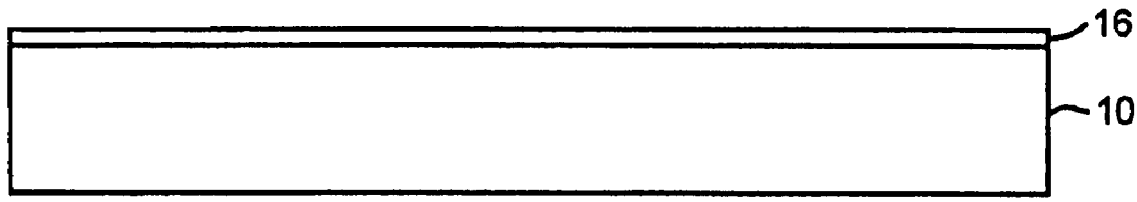
FIGS. 1A-1F schematically illustrate sequential phases of a semiconductor device fabrication method according to an embodiment of the present invention.
Figure 1B:
Figure 1B:
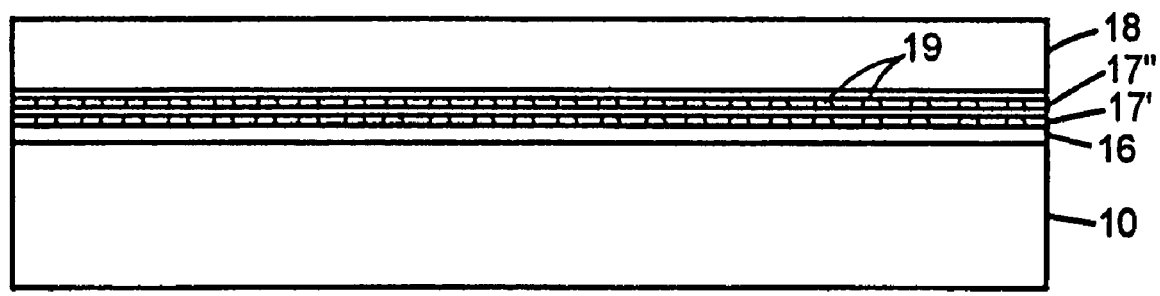

In FIG. 1A, a gate dielectric (hereinafter referred to as a gate oxide) 16 is formed on the top surface of the substrate 10. The gate oxide 16 is not limited as to a particular dielectric material. For example, the gate oxide 16 can be formed from silicon nitride ($Si_3N_4$). In certain aspects, however, the gate oxide 16 is formed from silicon dioxide using, for example, thermal oxidation at temperatures from about 700 to 1000° C. in an oxygen-steam ambient. Although not limited in this manner, the gate oxide 16 can have a thickness between about 25 and 200 angstroms. In certain current aspects, the gate oxide can have a thickness between about 25 and 40 angstroms.

After formation of the gate oxide 16, one or more layers of nanocrystals are formed over the gate oxide 16 using laser thermal annealing. As the number of layers of nanocrystals increases, the stored charge in each of the nanocrystals is better retained. However, as the number of layers increase, the average grain size of each additional layer decreases. In certain aspects, up to five layers of nanocrystals can be provided before the average grain size becomes potentially not effective, although the semiconductor device is not limited as to a maximum of five layers of nanocrystals.

One advantage of using laser thermal annealing to form the nanocrystals is that laser thermal annealing allows for a very precise control of the energy being delivered into the amorphous silicon (α-Si) in which the nanocrystals are formed. Furthermore, use of laser thermal annealing can provide very rapid heating and cooling of the amorphous silicon. When the amorphous silicon is cooled rapidly, a smaller grain size of the nanocrystals can be advantageously obtained after recrystallization. Although not limited in this manner, the nanocrystals can have average diameters of less than about 40 angstroms. In still other aspects, the nanocrystals can have average diameters of less than about 30 angstroms and greater than about 20 angstroms.

The semiconductor device is not limited in the manner in which the one or more layers of nanocrystals are formed using laser thermal annealing. For example, just a single laser thermal annealing process can be used after all of the amorphous silicon layers are formed, such that all of the amorphous silicon layers are concurrently melted and recrystallized to form the layers of nanocrystals. Alternatively, a laser thermal annealing process can occur after each layer of amorphous silicon is formed. In so doing, the formation of nanocrystals in each of the amorphous silicon layers can be better controlled.

The latter process is illustrated in FIGS. 2A-2F, as pertaining to the formation of two layers of nanocrystals.

After layers or superlattices 17', 17" of nanocrystals 19 have been formed, the invention is not limited as to the particular type of semiconductor device to be formed or the manner in which the semiconductor device is formed. For example, in FIG. 1B, the formation of a gate electrode typically involves forming a blanket layer of undoped polysilicon 18 over the layers or superlattices 17', 17" of nanocrystals 19, for example by LPCVD at temperatures from about 600 to 800° C., on the top surface of gate oxide 16. Although not limited in this manner, the polysilicon layer 18 can have a thickness from about 500 to 5000 angstroms. The polysilicon layer 18 can then be implanted with nitrogen ions, as depicted by arrows 20. The implanted nitrogen ions, for example, can be used to retard the diffusion of boron atoms. The implantation of the nitrogen ions can be at a dosage between about $5 \times 10^{14}$ and $5 \times 10^{15}$ dopants/cm$^2$ and at an energy level between about 20 and 200 keV.

Figure 1C:
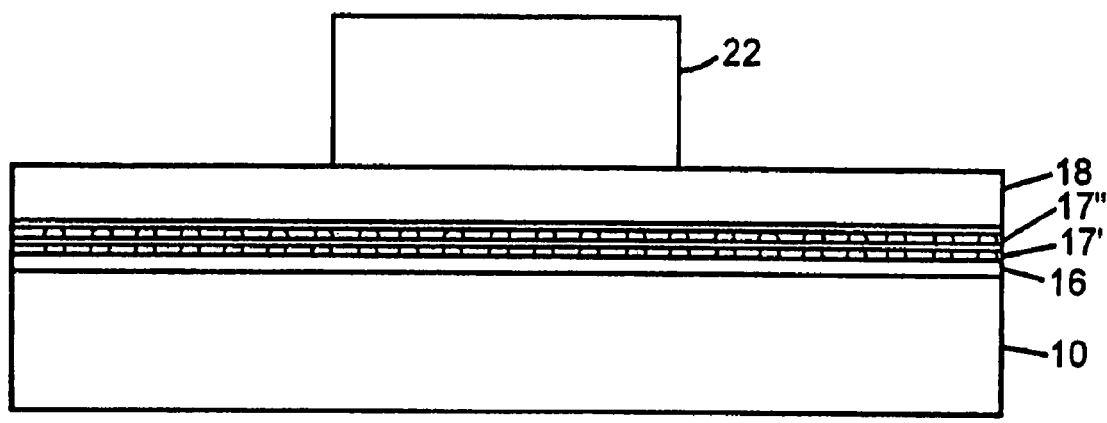

In FIG. 1C, the layers over the gate oxide 16 are etched to form the gate electrode. The etching of the gate typically involves forming a photoresist 22 on the polysilicon layer 18, and the photoresist 22 is selectively irradiated using a photolithographic system, such as a step and repeat optical projection system, in which ultraviolet light from a mercury-vapor lamp is projected through a first reticle and a focusing lens to obtain a first image pattern. The photoresist 22 is then developed, and the irradiated portions of the photoresist 22 are removed to provide openings in the photoresist 22. The openings expose portions of the polysilicon layer 18, which will thereby define the gate electrode.

Figure 1D:
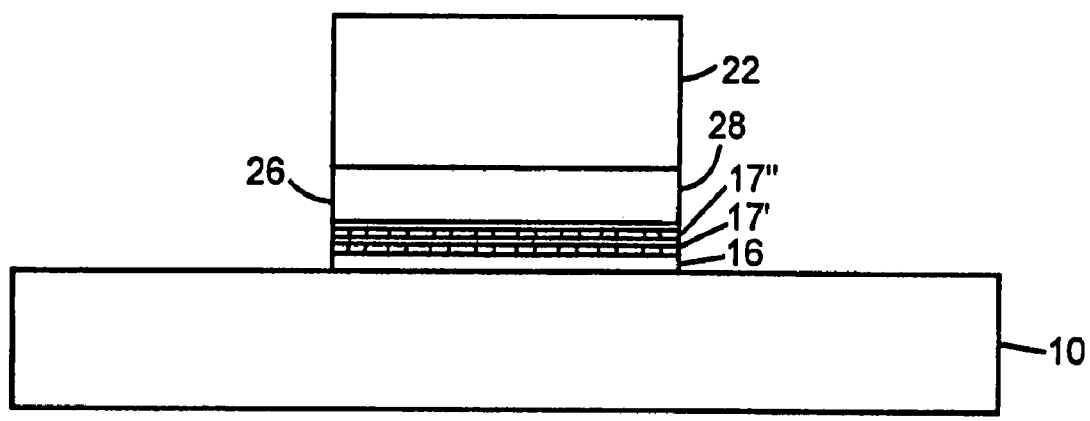

In FIG. 1D, an etch, typically anisotropic, is applied to remove the exposed portions of the polysilicon layer 18 and the underlying portions of the gate oxide 16 and the one or more layers 17', 17" of nanocrystals 19. After etching, the remaining portion of the polysilicon layer 18 provides a gate electrode 24 having opposing vertical sidewalls 26, 28. Although not limited in this manner, the width of the gate electrode 24 between the sidewalls 26, 28 can be between about 100 and 2500 angstroms.

Figure 1E:
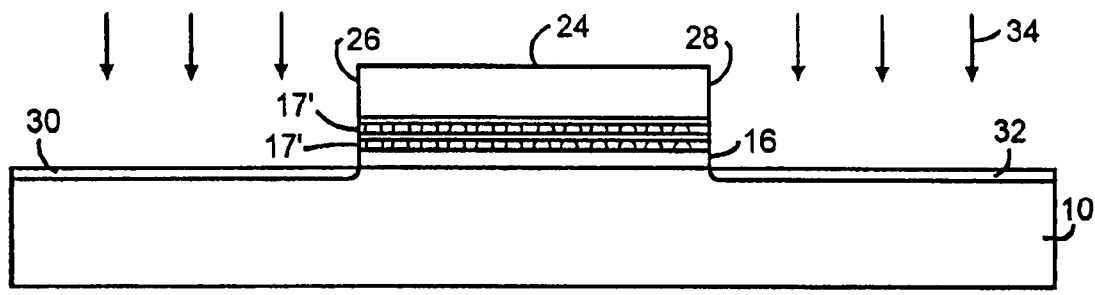

In FIG. 1E, the photoresist 22 is stripped, and lightly doped (LDD) source/drain extensions 30, 32 are formed by an ion implantation, as represented by arrows 34. The ion implantation may be an n-type dopant, such as arsenic or phosphorus, if an NMOSFET is desired, or a p-type dopant, such as boron, if a PMOSFET is desired. Illustrative examples of implant energies and dosages for doping respectively range from about 2 to 20 keV and from about $5 \times 10^{14}$ to $3 \times 10^{15}$ dopants/cm$^2$. The source/drain extensions 30, 32 are formed within the substrate 10 immediately adjacent to the sidewalls 26, 28 and are self-aligned with the gate electrode 24. After implantation, annealing is conducted to activate the source/drain extensions 30, 32 and to recrystallize the extensions. Alternatively, the annealing can occur after formation of the source/drain regions. Typically, the source/drain extensions 30, 32 extend down from the surface of the silicon substrate 10 to a depth of about 50 angstroms to 300 angstroms.

Figure 1F:
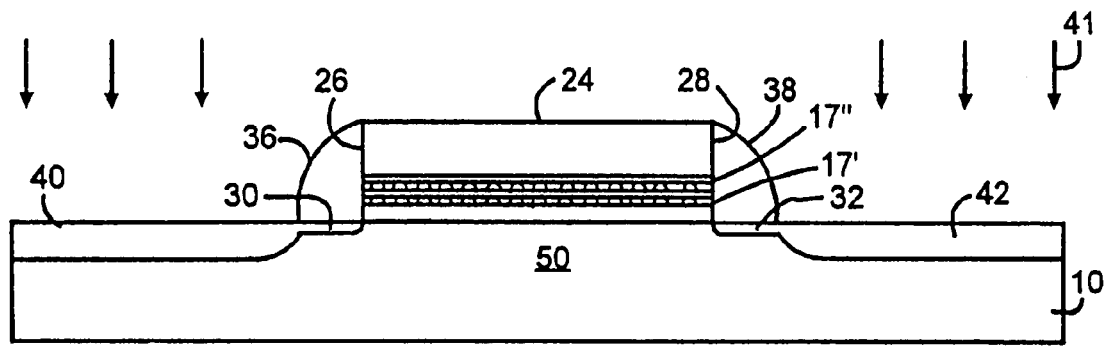

In FIG. 1F, sidewall spacers 36, 38 are formed following the implantation of the source/drain extensions 30, 32. Formation of the sidewall spacers 36, 38 involves blanket depositing a spacer material over the substrate 10. The spacer material can be silicon nitride or some other material such as plasma-enhanced oxide (PEOX) or tetraethoxysilane (TEOS) oxide. The blanket deposition is followed by an anisotropic etch, which removes the spacer material except for the sidewall spacers 36, 38 immediately adjacent to the sidewalls 26, 28 of the gate electrode 24 and over the substrate 10.

After formation of the sidewall spacers 36, 38, heavily doped (HDD) or moderately doped (MDD) source/drain regions 40, 42 are formed by a second ion implantation, as represented by arrows 44. The source/drain regions 40, 42 are formed within the substrate 10 and extend past the source/drain extensions 30, 32 immediately adjacent to the sidewall spacers 36, 38. The sidewall spacers 36, 38 act as masks, which protect portions of the source/drain extensions 30, 32 from being heavily doped. Illustrative examples of implant energies and dosages for doping respectively range from about 0.5 keV to 60 keV and from about $1 \times 10^{14}$ to $5 \times 10^{15}$ dopants/cm$^2$. A channel region 50 is disposed in the substrate 10, between the source/drain regions 40, 42 and under the gate dielectric 16.

After implantation of the source/drain regions 40, 42, the source/drain regions 40, 42 are activated, and any method of activating the source/drain regions 40, 42 is acceptable for use with the invention. For example, the source/drain regions can be activated by rapid thermal annealing or with a laser thermal annealing process. Although not limited in this manner, the source/drain regions 40, 42 typically extend down from the surface of the silicon substrate 10 to a final depth of about 400 angstroms to about 1000 angstroms, although ultra-shallow junctions can have depths of only 100 angstroms to about 200 angstroms.

Figure 2A:
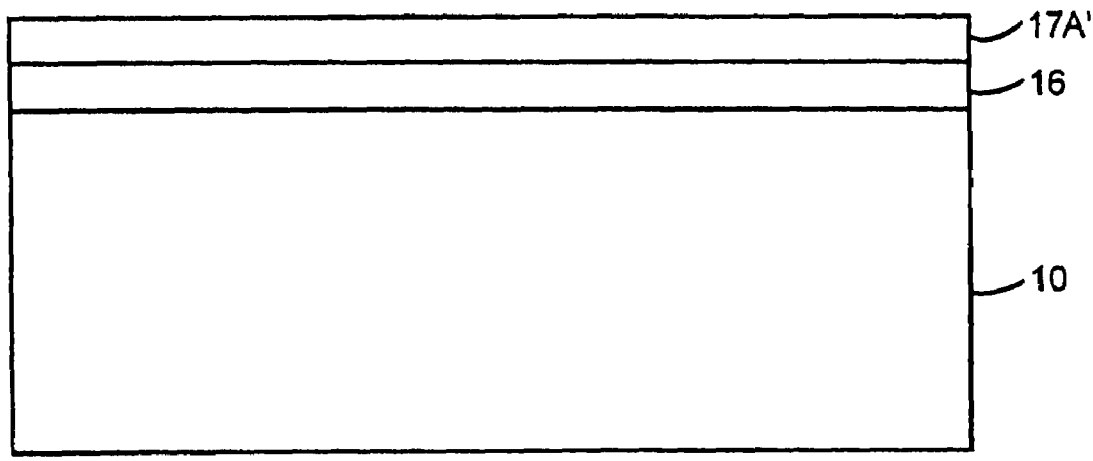
FIGS. 2A-2F schematically illustrate sequential phases of a nanocrystal layer formation method using a laser thermal annealing process according to an embodiment of the present invention.

FIGS. 2A-2F describe the formation of one or more layers or superlattices 17', 17" of nanocrystals 19. In FIG. 2A, a layer 17A' of amorphous silicon is formed over or on the gate oxide 16, and the invention is not limited in the manner in which the layer 17A' of amorphous silicon is formed. For example, the layer 17A' of amorphous silicon can be formed by low pressure chemical vapor deposition (LPCVD) or rapid thermal chemical vapor deposition (RTCVD) at low temperatures. Although not limited as to a particular thickness, in certain aspects, the layer 17A' of amorphous silicon can have a thickness between about 30 and 50 angstroms.

Figure 2B:
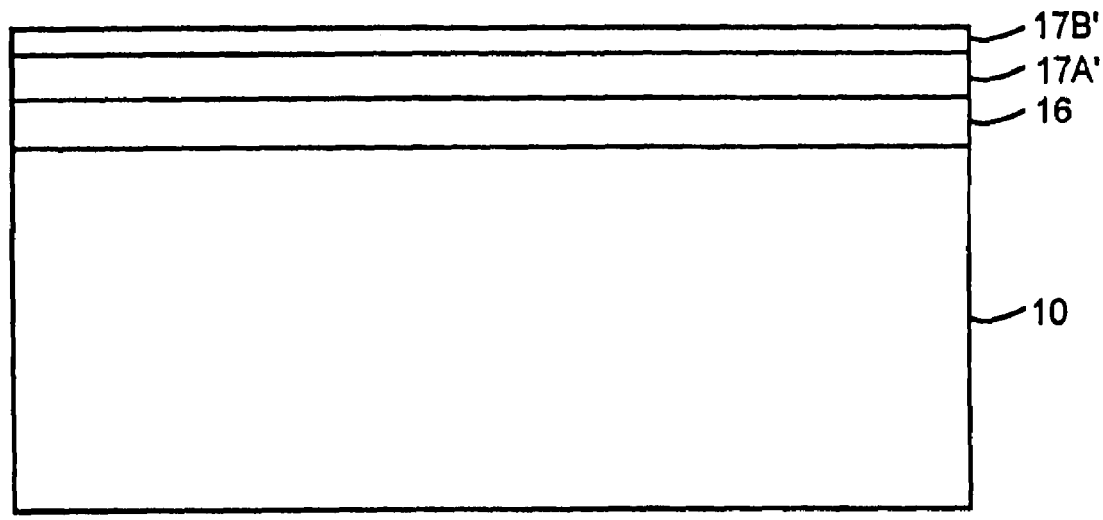

In FIG. 2B, a dielectric layer 17B' is formed over or on the layer 17A' of amorphous silicon, and the invention is not limited in the manner in which the dielectric layer 17B' is formed. For example, the dielectric layer 17B' can be formed by plasma enhanced chemical vapor deposition (PECVD) or LPCVD. The dielectric layer 17B' is also not limited as to a particular type of dielectric. For example, the dielectric layer 17B' can be formed from silicon nitride or, as in certain current aspects, silicon oxide. Although not limited as to a particular thickness, in certain aspects, the dielectric layer 17B' can have a thickness between about 25 and 40 angstroms. In certain aspects, however, the dielectric layer 17B' is formed by a low-temperature process (less than 450° C.) to prevent uncontrolled recrystallization.

Figure 2C:
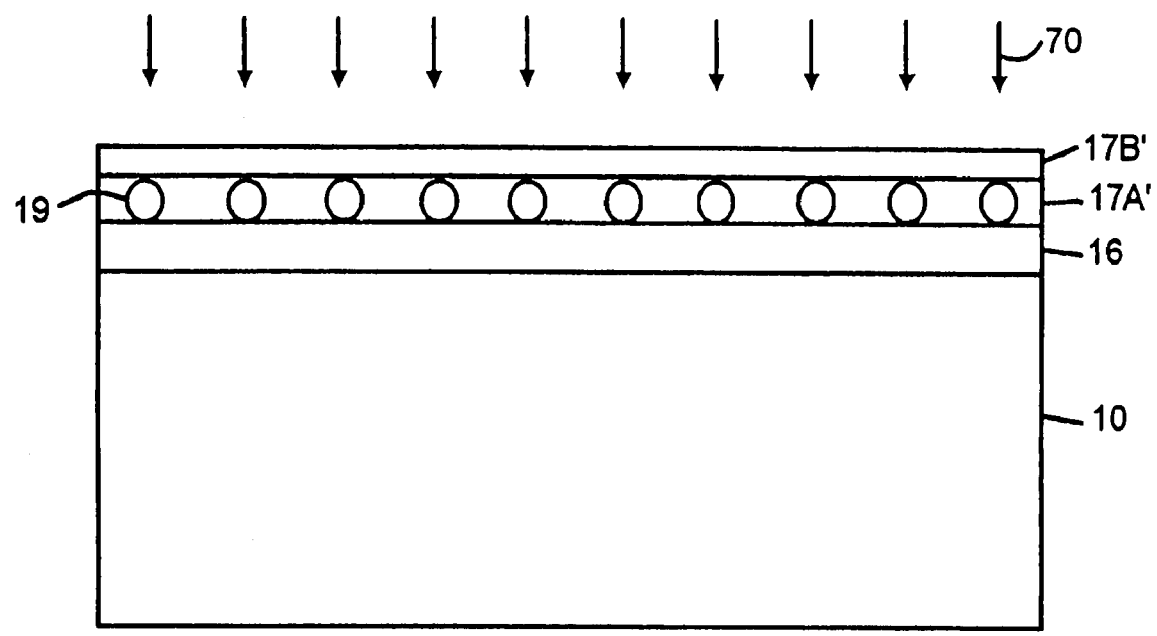

In FIG. 2C, nanocrystals 19 are formed in the layer 17A' of amorphous silicon using laser thermal annealing to form a superlattice of nanocrystals 19. With laser thermal annealing, the energy from the laser, represented by arrows 70, is applied to liquefy the layer 17A' of amorphous silicon. After the layer 17A' of amorphous silicon has been melted, which takes approximately 30-100 nanoseconds, the silicon will cool rapidly, within about one microsecond, and the silicon will recrystallize epitaxially to form the nanocrystals 19.

An example of a laser capable of providing this energy is a spatially homogenized 308 nm XeCl pulsed laser, although the invention is not limited in this manner. The process parameters to be varied include energy fluence, and energy fluence can be modified by adjusting the power or wattage of the pulses, the number of pulses of the laser, and/or the length of the pulses. The energy and power of the laser can vary in accordance with different applications. For example, the fluence range for laser irradiation can extend from about 50 mJ/cm$^2$ to about 1.3 J/cm$^2$. The energy fluence of the laser at the surface can determine the grain size of the nanocrystals 19.

Figure 2D:
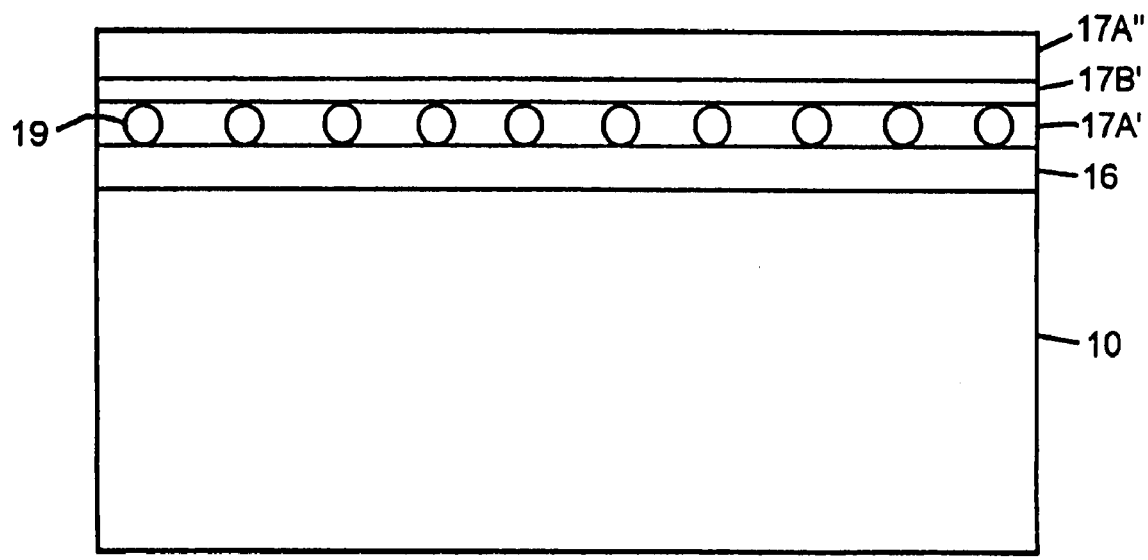

In FIG. 2D, a second layer 17A" of amorphous silicon is formed over or on the dielectric layer 17B'. Although not limited as to a particular thickness, in certain aspects, the second layer 17A" of amorphous silicon can have a thickness between about 30 and 50 angstroms.

Figure 2E:
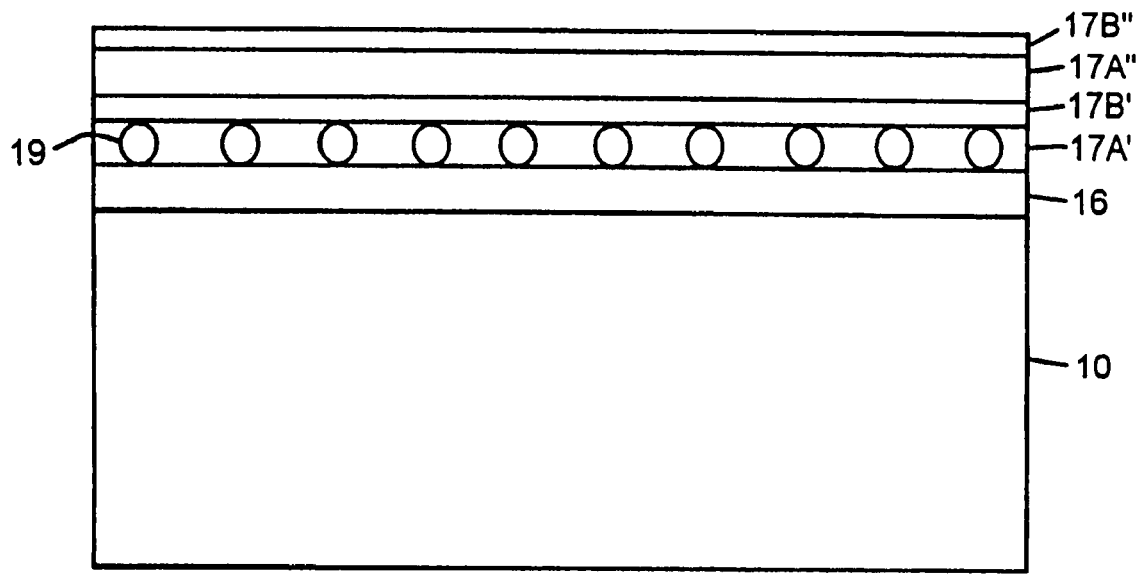

In FIG. 2E, a second dielectric layer 17B" is formed over or on the second layer 17A" of amorphous silicon. Although not limited as to a particular thickness, in certain aspects, the second dielectric layer 17B" can have a thickness between about 25 and 40 angstroms.

Figure 2F:
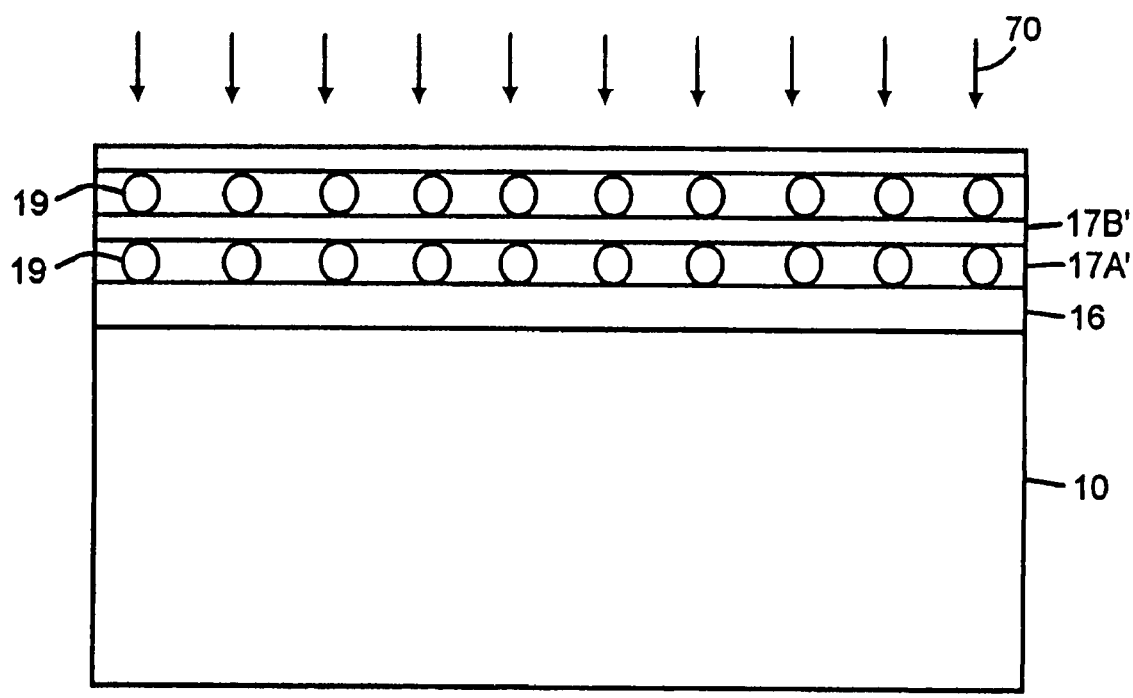

In FIG. 2F, nanocrystals 19 are formed in the second layer 17A" of amorphous silicon using laser thermal annealing. The energy from the laser, represented by arrows 70, can be applied to liquefy the second layer 17A" of amorphous silicon. Upon recrystallization of the liquefied second layer 17A" of amorphous silicon, the nanocrystals 19 are formed.

By forming nanocrystals with laser thermal annealing, nanocrystals having average grain sizes less than 40 angstroms can be provided. A smaller sized nanocrystal can achieve Coulomb Blocking at higher operating temperatures. Furthermore, a smaller sized nanocrystal retains its charge longer than a larger nanocrystal.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well-known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concepts as expressed herein.

The invention claimed is:

1. A method of manufacturing a semiconductor device, comprising the steps of:
    forming a gate dielectric over a channel region in a substrate;
    forming a layer of amorphous silicon over the gate dielectric;
    forming a layer of nanocrystals by laser thermal annealing the layer of amorphous silicon;
    forming a dielectric layer on the layer of amorphous silicon; and
    repeating the steps of forming the layer of amorphous silicon and forming the dielectric layer.

2. The method of manufacturing a semiconductor device according to claim 1, wherein the step of forming nanocrystals occurs only after a final amorphous silicon layer is formed.

3. A method of manufacturing a semiconductor device, comprising the steps of:
    forming a gate dielectric on a substrate;
    forming a first layer of amorphous silicon on the gate dielectric;
    forming a first dielectric layer on the first layer of amorphous silicon;
    forming a first layer of silicon nanocrystals by laser thermal annealing the first layer of amorphous silicon;
    forming a second layer of amorphous silicon on the first dielectric layer;
    forming a second dielectric layer on the second layer of amorphous silicon; and
    forming a second layer of nanocrystals by laser thermal annealing the second layer of amorphous silicon, wherein
    an average diameter of the nanocrystals is less than 40 angstroms.

4. The method of manufacturing a semiconductor device according to claim 3, wherein a thickness of the first and second dielectric layers is between about 25 to 40 angstroms.

5. The method of manufacturing a semiconductor device according to claim 3, wherein the average diameter of the nanocrystals is less than 30 angstroms.

6. A semiconductor device, comprising:
    a substrate;
    a gate dielectric formed on the substrate;
    at least one superlattice of silicon nanocrystals formed over the gate dielectric; and
    a dielectric layer formed on each layer of nanocrystals, wherein
    an average diameter of the nanocrystals is less than 40 angstroms.

7. The semiconductor device according to claim 6, wherein the nanocrystals are formed by laser thermal annealing.

8. The semiconductor device according to claim 6, wherein the average diameter of the nanocrystals is less than 30 angstroms.

9. The semiconductor device according to claim 6, wherein the thickness of the dielectric layer is between about 25 to 40 angstroms.

10. The semiconductor device according to claim 6, further comprising multiple superlattice layers wherein each superlattice layer includes a silicon layer including the nanocrystals and the dielectric layer.

11. A semiconductor device, comprising:
    a substrate;
    a superlattice structure, the superlattice structure including:
        a dielectric layer, and
        a silicon layer with nanocrystals having an average diameter less than 30 angstroms; and
    gate material disposed over the superlattice structure.

12. The semiconductor device according to claim 11, wherein the nanocrystals are formed by laser thermal annealing.

* * * * *